(12) United States Patent
Liao et al.

(10) Patent No.: US 11,798,800 B2
(45) Date of Patent: Oct. 24, 2023

(54) METHOD AND APPARATUS FOR SOLVENT RECYCLING

(71) Applicant: TAIWAN SEMICONDUCTOR MANUFACTURING COMPANY, LTD., Hsinchu (TW)

(72) Inventors: Chun-Wei Liao, Taoyuan (TW); Tung-Hung Feng, Hsinchu (TW); Hui-Chun Lee, Hsinchu (TW); Shih-Che Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/359,038

(22) Filed: Jun. 25, 2021

(65) Prior Publication Data
US 2022/0415646 A1 Dec. 29, 2022

(51) Int. Cl.
| | |
|---|---|
| *B08B 9/00* | (2006.01) |
| *B08B 3/04* | (2006.01) |
| *H01L 21/02* | (2006.01) |
| *H01L 21/67* | (2006.01) |
| *H01L 21/311* | (2006.01) |
| *G03F 1/80* | (2012.01) |

(52) U.S. Cl.
CPC .......... *H01L 21/02057* (2013.01); *G03F 1/80* (2013.01); *H01L 21/31133* (2013.01); *H01L 21/6708* (2013.01)

(58) Field of Classification Search
None
See application file for complete search history.

(56) References Cited

U.S. PATENT DOCUMENTS

| 6,076,979 | A * | 6/2000 | Mimasaka | G03D 5/04 |
| | | | | 118/52 |
| 11,004,702 | B2 * | 5/2021 | Tanaka | H01L 21/67178 |
| 2003/0059534 | A1 * | 3/2003 | Nishijima | H01L 21/6715 |
| | | | | 427/240 |
| 2009/0169758 | A1 * | 7/2009 | Ryu | H01L 21/67248 |
| | | | | 118/313 |
| 2010/0051059 | A1 * | 3/2010 | Kometani | H01L 21/6715 |
| | | | | 134/21 |
| 2011/0143549 | A1 | 6/2011 | Tange et al. | |
| 2012/0255581 | A1 * | 10/2012 | Kometani | B08B 9/00 |
| | | | | 134/99.1 |
| 2013/0319470 | A1 * | 12/2013 | Kai | H01L 21/67051 |
| | | | | 134/22.12 |
| 2014/0216500 | A1 | 8/2014 | Hsiao et al. | |
| 2017/0189932 | A1 | 7/2017 | Hung et al. | |
| 2017/0229323 | A1 * | 8/2017 | Watanabe | B24B 37/10 |
| 2018/0039188 | A1 | 2/2018 | Mertens et al. | |
| 2018/0335699 | A1 | 11/2018 | Wang | |
| 2019/0176179 | A1 * | 6/2019 | Yoshida | B05B 1/24 |
| 2020/0004157 | A1 | 1/2020 | Lin et al. | |

(Continued)

*Primary Examiner* — Sylvia MacArthur
(74) *Attorney, Agent, or Firm* — McDermott Will & Emery LLP (57) ABSTRACT

A solvent recycle system minimizes chemical consumption used in various semiconductor processes. The solvent is recycled from a nozzle bath via the addition of buffer tank to connect the bath and circulation pumps. Improvements to the bath design further maintain solvent cleanness by preventing intrusion of particles and overflow conditions in the bath.

20 Claims, 5 Drawing Sheets

(56) References Cited

U.S. PATENT DOCUMENTS

2020/0038897 A1\* 2/2020 Kamimura ............ B05B 1/3093
2020/0057377 A1   2/2020 Wang et al.
2020/0124971 A1   4/2020 Liu et al.
2020/0346143 A1  11/2020 Park et al.

\* cited by examiner

METHOD AND APPARATUS FOR SOLVENT RECYCLING

BACKGROUND

In the Semiconductor industry, various solutions, such as positive or negative photoresists, positive tone developers (PTD), negative tone developers (NTD), and reducing resist consumption (RRC) solvents, are used in various lithography processes. However, the impurities that build up in these solvents, which are introduced during idle times and wafer processing, become problematic to wafer manufacturing quality and yield performance. It has been desired to prevent such particles from occurring in lithography processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features can be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include embodiments in which the first and second features are formed in direct contact, and also include embodiments in which additional features are formed between the first and second features, such that the first and second features are not in direct contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device is otherwise oriented (rotated 90 degrees or at other orientations) and the spatially relative descriptors used herein are likewise interpreted accordingly In addition, the term "made of" means either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described. The terms solvent and solution are used interchangeably herein unless otherwise indicated.

Figure 1:
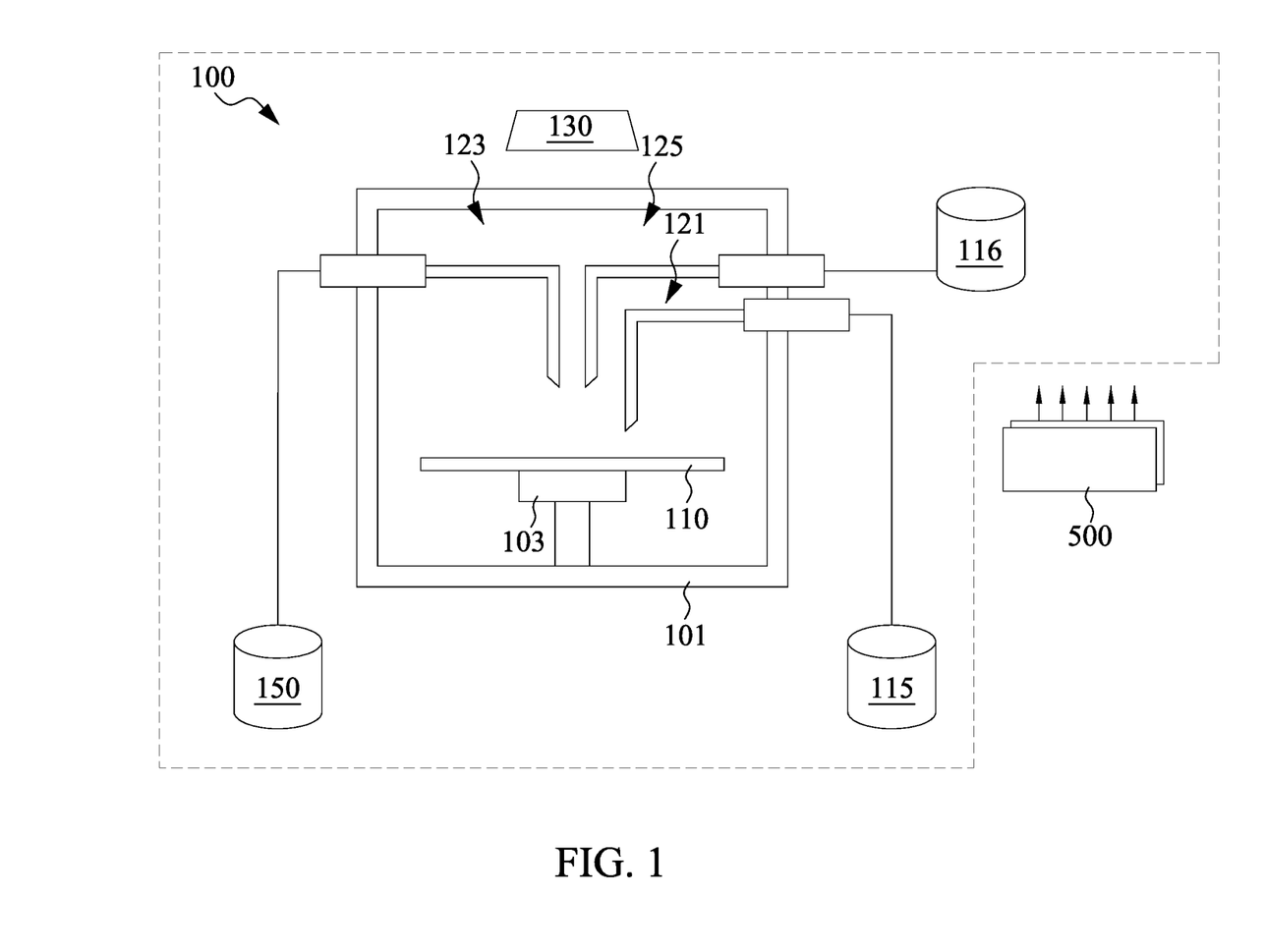
FIG. 1 is a wafer processing apparatus in accordance with some embodiments.

Semiconductor manufacturers prevent particles in solutions by increasing the regular dummy interval dispense counts in order to achieve a more stable defect performance, however, large portions of these solvents are correspondingly wasted, resulting in higher operational costs. For cost reduction, a solvent recycle system is introduced on the photolithography track for recovering photoresist, developers, RRC and other solvents and solutions. FIG. 1 is a schematic view of an apparatus 100 according to various embodiments. In some embodiments, the apparatus 100 is a lithography or photolithography apparatus for processing a workpiece (e.g., a wafer or substrate), in whole or in part, by advanced manufacturing processes. In some embodiments, the apparatus 100 is a substrate cleaning apparatus. In some embodiments, the apparatus 100 is a developing apparatus. In some embodiments, the apparatus 100 is a coating apparatus. In some embodiments, the apparatus 100 is a wet etching apparatus. In some embodiments, the apparatus 100 is a polishing apparatus. One of ordinary skill in the art readily understands that one or more of these functions are utilized together with the apparatus 100 in various embodiments.

The embodiments disclosed herein will first be described in detail with respect to a lithography apparatus 100, such as a photoresist coater and/or a photoresist developer, which are used for accomplishing deep ultraviolet (DUV) lithography, extreme ultraviolet (EUV) lithography, e-beam lithography, and x-ray lithography, in various embodiments. A lithography apparatus 100 includes a housing or an enclosure 101 in which a substrate holder 103 is disposed. The substrate holder 103 is configured to hold a substrate 110 and, in some embodiments, to rotate the substrate 110 at various speeds. Further, an ultraviolet (UV) light source 130 is disposed inside or outside the housing 101 in some embodiments.

In various embodiments, the apparatus 100 includes a fluid nozzle 123 to dispense a chemical solution or solvent (i.e., a developer or a photoresist) from a facility fluid supply 150 during a lithography or etching process. In various embodiments, the apparatus 100 includes one or more additional nozzles, such as a cleaning nozzle 121 configured to dispense a cleaning solution from a cleaning fluid source 115, and a water nozzle 125 configured to dispense deionized water from a water source 116, onto the wafer 110 and/or to clean the fluid nozzle 123 during an idle period and the like In some embodiments, one or more of the nozzles 121, 123 and 125 are spin nozzles and are movable in horizontal and vertical directions with respect to the substrate holder 103. In other embodiments, the solution is photoresist. Various embodiments described herein with respect to the nozzle 123 are equally applicable to the other nozzles 121 and 125 when present.

At least a part of the operations of the apparatus 100 is controlled by one or more controllers 500, such as a computer system including one or more processors and appropriate data storage in various embodiments. In various embodiments, the controller 500 controls the operations of, for example, the substrate holder 103, the nozzles 121, 123 and 125, components controlling fluid flows of the circulated solutions, monitoring of various sensors, alarming of abnormal conditions or functions, and operation of the IV light source 130.

The substrate 110 includes a semiconductor wafer or a glass substrate in various embodiments. In some embodiments, a semiconductor wafer is used. In those embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn). Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. In some embodiments, the substrate 110 includes a silicon-on-insulator (SOI) structure.

In some embodiments, one or more layers are disposed on the substrate 110. In some embodiments, one or more of the layers are patterned. In other embodiments, the one or more layers have no patterns. In some embodiments, the one or more layers includes an insulating material layer, a conductive material layer, an organic material layer, an inorganic material layer, a metallic layer or any combination thereof.

A chemical solution is applied, from the nozzle 123, onto the surface of the substrate 110, which contains or generates particles. The particles are any kind of particles made of, for example, organic materials, inorganic materials, dielectric materials, ceramic materials and/or metal or metallic materials in some embodiments. The particles include nanoparticles having sizes of less than about fifty nanometers (nm) in some embodiments. In certain embodiments, the size of the particles ranges from about 0.1 nm to about 40 nm. Such particles adhere on the surface of the substrate 110 by physical absorption, such as van der Waals force and/or chemical absorption by chemical bonding. The chemical bonding includes hydrogen bonding and ionic bonding.

In various embodiments, the chemical solution is spin-coated on the surface of the substrate 110. Other methods, such as spraying, can also be utilized to apply the chemical solution over the substrate 110. In some embodiments, the chemical solution is applied onto the surface of the substrate 110 for a time period, for example, of about one second to thirty seconds, and then the substrate 110 is kept spinning to obtain a desired thickness of a film formed from the chemical agents contained in the chemical solution. By applying the chemical solution, the chemical solution covers substantially the entire surface of the substrate 110. Then, the one or more chemical agents react with the particles disposed over the substrate 110.

In a semiconductor manufacturing process, a fine circuit pattern is produced by uniformly applying photoresist including a photosensitive material and a solvent on a conductive metal film or an oxide film formed on the substrate 110 by a spin-coating method, and then performing exposure, development, etching, and peeling processes.

In such embodiments, the exposure process is implemented in such a manner that a desired pattern is finely exposed to a coating film using light of a short wavelength in the ultraviolet region, and is thus very sensitive to external or internal contaminants. Thus, contaminants such as unnecessary photoresist residues applied on an edge portion or a backside portion of the substrate 110 in a coating process is removed because they become a cause of contamination in a subsequent exposure process.

Photoresist is light sensitive material used in many semiconductor manufacturing processes. Photoresist provides for a spin-on masking layer that can be selectively patterned using a photolithography process to form intricate patterns on a semiconductor substrate. For example, photoresist layers are often formed to selectively mask an underlying semiconductor substrate 110 from a semiconductor manufacturing process, such as an implantation or etch. After the semiconductor manufacturing process has been completed, the photoresist layer is removed from the semiconductor substrate by way of an ashing process. Ashing processes are plasma processes that form a plasma having a monatomic reactive species (e.g., such as oxygen or fluorine), which combines with photoresist to form an ash that is evacuated from a processing chamber. After an ashing processes has been completed, a photoresist residue comprising metal impurities remains on the semiconductor substrate. Single wafer cleaning tools are able to remove the photoresist residue from the semiconductor substrate with a high particle removal efficiency (PRE) by using a reactive chemistry. For example, single wafer cleaning tools can be configured to perform a wet etch using a cleaning solution, comprising sulfuric acid ($H_2SO_4$) and hydrogen peroxide ($H_2O_2$), to remove the photoresist residue from a semiconductor substrate in various embodiments.

Various cleaning operations have been proposed and utilized in semiconductor manufacturing operations to remove particles on wafers. For example, jet spraying methods or ultrasonic cleaning methods have been utilized. However, as the minimum pattern sizes decrease, more gentle cleaning operations that do not cause damage to fabricated patterns by mechanical force are needed. In addition, as the minimum pattern sizes decrease, sizes of particles to be removed from the wafers also decrease.

During semiconductor fabrication, a variety of photolithographic processes are performed to apply layers to, or perform implants in, the substrate 110, as described in the foregoing. The photosensitive photoresist is applied to the wafer, and patterned using a photomask to form a hard mask for a subsequent deposition or etching process, in various embodiments. The cost of photoresist is a significant material cost in semiconductor fabrication. Accordingly. Reducing Resist Consumption (RRC) processes are widely used in the semiconductor industry to decrease the cost of photo resist per wafer.

In some embodiments, an organic RRC solvent is used to reduce photoresist consumption. In some embodiments, the RRC solvent comprises at least one of the following: propylene glycol methyl ether (PGME), propylene glycol methyl ether acetate (PGMEA), cyclohexanone, cyclopropanone, methyl-N-pentyl ketone, ethyl lactate, n-methyl-2-pyrrolidone (NMP) and combinations thereof. In some embodiments, the photoresist comprises organic resin and solvent. It should be noted that these are just examples and are not intended to be limiting.

Various embodiments herein are directed to providing a thinner composition or solution capable of effectively removing unnecessary photoresist applied on an edge portion or a backside portion of the substrate 110. More particularly, embodiments of the invention relate to a thinner composition capable of reducing the amount of photoresist used in a RRC coating process, an edge bead removed (EBR) process or the like, and removing unnecessary photoresist on an edge portion or a backside portion of the substrate 110.

A wafer surface is prepared by applying a cleaning solvent onto the surface of the substrate 110 in some embodiments. The manner of dispensing the cleaning solvent varies depending on the application desired. The solvent can be dispensed on the wafer while the wafer is not rotating, known as a "static RRC dispense" process. After the static RRC dispense, the wafer is first spun at a low revolutions per minute (rpm) to uniformly spread the solvent. Once the solvent reaches the wafer edge, the rpm are accelerated to a final spin speed. Another approach is to dispense the cleaning solvent on the wafer that is spinning slowly in order to uniformly coat the wafer, followed by acceleration to the final spin speed. This is referred to as a "dynamic RRC dispense."

Once the solvent has been dispensed onto the wafer layer, a photoresist layer can thereafter be spin coated onto the surface. In both the static RRC and the dynamic RRC dispense approaches, however, the photoresist layer applied onto the wafer surface exhibits poor coverage, poor coating, or pinholes (very small holes) in the resist. Poor coating or uneven resist coating are undesirable because these wafers can exhibit low yields or fatal defects. Pinholes are microscopically small voids that pass completely through the resist to the substrate material. They are undesirable for subsequent etch processing because the etch chemicals can pass through the small voids and damage the underlying substrate material. These problems are more evident in wafers produced at advanced processing nodes, such as twenty-eight nm and below where more device features are packed on the substrate 110.

In various embodiments, the apparatus includes a coating apparatus that performs a coating operation process. Coating material is sent from the source 150 to the nozzle 123. In some embodiments, the wafer is spun to a first angular speed and a pre-wet material, such as a RRC material, is dispensed. The substrate holder 103 rotates the substrate 110 at high speeds, e.g., about 100 rpm to about 2000 rpm. The substrate 110 is rotated, either after or as the coating material is dispensed onto the center of the substrate 110. The coating material dispensed onto the center of the substrate 110 is spread outwardly toward the edges of the wafer by surface tension generated by the centrifugal force of the rotating substrate 110, such that the coating material is uniformly coated on the surface of the substrate 110. In various embodiments, a cup (not shown) catches the excess coating material ejected from the rotating substrate 110, which is then directed to a drain.

In another aspect of the present disclosure, the apparatus 100 is used in connection with a wet etching operation, e.g., tetramethylammonium hydroxide (TMAH) etching processes, potassium hydroxide (KOH) etching processes, and other etching platforms, alone or in conjunction with the lithography processes.

In another aspect of the present disclosure, the apparatus 100 is an etching apparatus that includes a sulfuric acid electrolysis unit, a sulfuric acid supply unit, a controller 500, an etching unit and an etching solution supply unit. The sulfuric acid electrolysis unit includes an anode, a cathode, a membrane provided between the anode and the cathode, an anode chamber provided between the anode and the membrane, and a cathode chamber provided between the cathode and the membrane; and the sulfuric acid electrolysis unit is configured to produce an etching solution containing an oxidizing substance by electrolyzing a sulfuric acid solution in the anode chamber to produce the oxidizing substance. The sulfuric acid supply unit is configured to supply the sulfuric acid solution to the anode chamber. The controller 500 is configured to control a produced amount of the oxidizing substance. The etching unit is configured to etch a workpiece, such as substrate 110. The etching solution supply unit is configured to supply the etching solution to the etching unit. The controller 500 controls the produced amount of the oxidizing substance to produce an etching solution having a prescribed oxidizing species concentration.

In some embodiments, the apparatus 100 is a developing apparatus that performs a developing process on a resist layer of the substrate 110, thereby forming a patterned resist layer. In some embodiments, the resist layer includes a negative tone material (or a negative tone resist), where portions of the resist layer exposed to radiation become insoluble (or exhibit reduced solubility) to a developer, and unexposed portions of the resist layer remain soluble to the developer. In such embodiments, a negative tone developer (NTD) process is performed to remove unexposed portions of the patterned resist layer. For example, an NTD developer is applied to the resist layer dissolving unexposed portions, and leaving a patterned resist layer. In some embodiments, the NTD is organic solvent-based. Suitable organic solvent include: n-butyl acetate, ethanol, hexane, benzene, toluene, and/or other suitable solvents. Applying the NTD developer includes spraying it on a patterned resist layer by a spin-coating process or the like.

In alternate embodiments, the developer is a positive tone developer (PTD), e.g., containing tetramethylammonium hydroxide (TMAH) dissolved in an aqueous solution. A concentration of the developing chemical (e.g., TMAH or nBA) in the developer (or the "developer concentration") is flexibly adjusted during the developing process as a function of time in some embodiments In an embodiment, the developer starts with a first developer concentration. After the resist has been developed for a first duration, the developer is changed to have a second developer concentration that is different from the first developer concentration, and the resist is developed for a second duration. In an embodiment, the first developer concentration is lower than the second developer concentration.

An apparatus 100 that applies the developer to the substrate 110 includes a solution source 150, a supply pipe, and the supply nozzle 123 together. The supply nozzle 123 is movably positioned directly above the center of the substrate 110. In some embodiments, the developer is dispensed through the supply nozzle 123 over the substrate 110 while it is spun. After the developer is dispensed onto the center of the substrate 110, it flows to other parts of the substrate surface due to a centrifugal force generated by the spin. The apparatus 100 further includes a cup and a drain (not shown) as previously described in various embodiments. Regarding this and the other embodiments of the apparatus 100 described above, it will be understood that not all advantages have been necessarily discussed herein, no particular advantage is required for all embodiments or examples, and other embodiments or examples offer different advantages.

In the various manufacturing processes described above, a regular dispense (dummy interval) is required for solvent lines on the lithography track in order to minimize the idle effect and improve defect performance. In advanced technology nodes, tiny impurities become more critical to yield performance. Therefore, the dummy frequency for photoresist, PTD, NTD and RRC solvents is set to be higher in order to achieve better defect control. Impurities are generated, for example, when the nozzle 123 dries during idle time or as a result of debris from the lithography processes. PTD, NTD, RRC and other mentioned solvents dispensed from the nozzle 123 have long been supposed not to be useful after application due to such impurities, and so are directed to a drain, both after wafer processing, as well as dummy intervals. As a result, 25% or more of these solvents are wasted. In high volume manufacturing conditions (i.e., >4000 workpieces produced per day), this results in significant increases in manufacturing costs. Accordingly, in comparison with such approaches, various embodiments of the systems and methods described herein reduces solvent waste by up to 25%.

In order to offset such costs and reduce materials usage, a recycling system is introduced to the lithography track along with a new bath design to assist in recycling these solvents. In various embodiments introduced below, the cup described above is replaced or supplemented by a bath that is, in various embodiments, improved and integrated with a buffer tank such that the solution is sent out through the buffer tank for further processing. Solvent can then be directed towards circulating pumps and returned to the nozzle 123 via the buffer tank.

Figure 2:
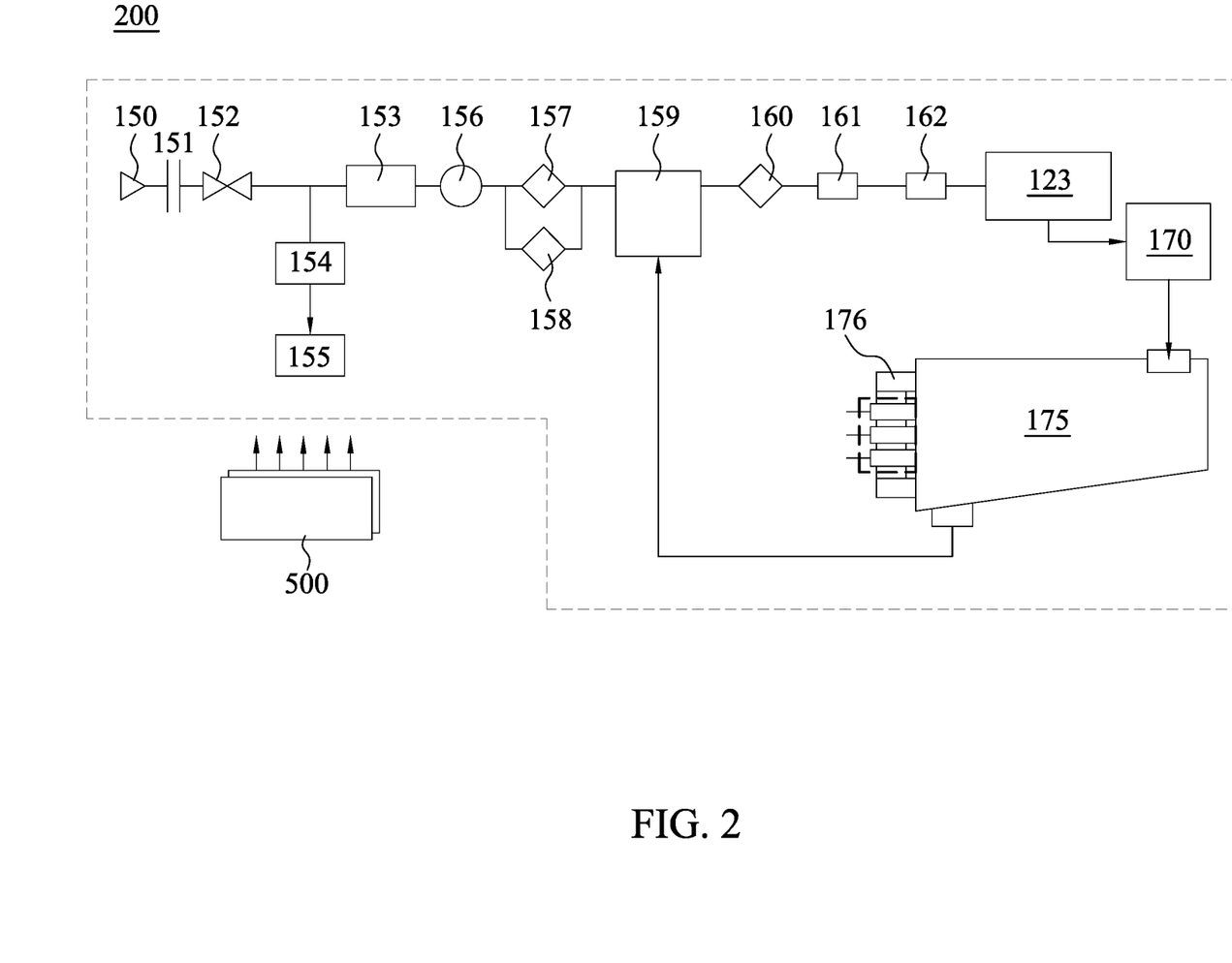
FIG. 2 is a solution circulation and recycling system in accordance with some embodiments.

FIG. 2 displays a solution circulation and recycling system 200 according to an embodiment of the present disclosure. The system 200 includes a facility fluid supply 150 and nozzle 123 as previously described with respect to FIG. 1. The supplied fluid is a gas or a liquid in various embodiments. Any of the solvents and solutions described above are supplied from the facility fluid supply 150.

A shut down valve 151 is first provided along the solvent circulation path of the system 200 from the fluid supply source 150, in various embodiments. In some embodiments, the shutdown valve 151 is activated in response to an alarm condition, when it will close to prevent further circulation of the solvent. During normal operating conditions of the apparatus 100, the shutdown valve 151 is normally open.

A pressure equalization valve 152 is next provided along the solvent circulation path of the system 200, in various embodiments. The pressure equalization valve 152 establishes and maintains a constant pressure in the solvent circulation path so as to circulate the solvent smoothly from the fluid supply source 150.

Two air-controlled valves (AV) 153, 154 are next disposed along the solvent circulation path of the system 200, in various embodiments. The AV valve 153 branches from the solvent circulation to direct solvent to a drain 155, when opened. In various embodiments, the AV valve 153 is normally closed during operation of the apparatus. The AV valve 153 is opened for example, to purge the solvent from the solvent circulation path when required.

The AV valve 154 is disposed along the solvent circulation path after the AV valve 153 in order to direct flow of the solvent there-along. The AV valve 154 is normally open. The AV valve 154 is closed when desired to prevent further circulation of the solvent, for example, during an alarm condition or periodic maintenance. The AV valves 153, 154 are controlled by the controller 500, in various embodiments.

A regulator 156 is next disposed along the solvent circulation path of the system 200, in various embodiments. The regulator 156 regulates the flow rate of the solvent there through. In some embodiments, the regulator 156 is controlled by the controller 500.

Filters 157, 158 are next disposed in parallel along the solvent circulation path of the system 200, in various embodiments. The filters 157, 158 remove any particles and contaminants from the solvent. The filters 157, 158 are disposed in parallel to maintain a steady flow rate as solvent circulates there through. For example, owing to a distributed low pressure or when it is new or replaced, a resist solution passes through the filter 158 relatively slowly in some instances. A pressure difference of the resist in the filter 157 is controlled to compensate for the relative slow motion through the filter 158. The resist is controlled to pass through at an appropriate pressure and an appropriate speed by the regulator 156. If the resist were to pass through the filters 157, 158 at too high a pressure, i.e., at a very high speed, polar foreign materials are not sufficiently filtered from the solvent. If the resist were to pass through the filters 157, 158 at too low of a pressure, i.e., at a very slow speed (e.g., slower than desired), productivity is degraded and more residues could occur due to the slow fluidity. In various embodiments, the filter 157 includes a polar filter, and the filter 158 includes a non-polar filter. In other embodiments, the filter 157 include a non-polar filter, and the filter 158 includes a polar filter. In some embodiments, both filters 157, 158 are polar filters In other embodiments, both filters 157, 158 are non-polar filters.

A pump chemical supply (PCS) pump 159 is next disposed along the solvent circulation path of the system 200, in various embodiments. In some embodiments, the PCS pump 159 circulates solvent from outside the apparatus 100 into the interior thereof. In the various embodiments described herein, the PCS pump 159 also circulates recovered solvent from the buffer tank 175, as described below. In various embodiments, the controller 500 controls the function of the PCS pump 159.

A filter 160 is next disposed along the solvent circulation path of the system 200, in various embodiments. In some embodiments, the filter 160 filters out contaminants that are introduced to the solvent by the PCS pump 159, or from the recovered solvent received via buffer tank 175.

A flow meter 161 is next disposed along the solvent circulation path of the system 200 in various embodiments. The flow meter 161 measures the flow rate of the solvent through the solvent circulation path In some embodiments, the controller 500 monitors the flow rate by communicating with the flow meter 161.

An AV valve 162 is next disposed along the solvent circulation path of the system 200 in various embodiments. The AV valve 162 is closed by the controller 500, in some embodiments, when the flow rate as measured by the flow meter 161 is to low or too high. The AV valve 162 is normally open in various embodiments so as to allow solvent flow to the nozzle 123.

The nozzle 123 is next disposed along the solvent circulation path of the system 200 in various embodiments. The solvent is dispensed by the nozzle 123 as described previously. In some embodiments, the nozzle 123 dispenses solvent onto the substrate 110 during semiconductor manufacturing processes. In some embodiments, the solvent is then directed into a cup (not shown, to the drain 155. In other embodiments, the solvent is directed to a bath 170. In some embodiments, the substrate 110 is disposed between the nozzle 123 and the bath 170 during operation of the apparatus 100. In other embodiments, the nozzle 123 is directed away from the substrate 110 and into the bath 170, for example during a dummy interval, in order to dispense solvent therein for recovery.

The bath 170, in various embodiments, directs solvents to a drain, such as drain 155. In other embodiments, the bath 170 directs the collected solvent to a buffer tank 175.

The buffer tank 175 collects the solvent from the bath 170 and directs the recovered solvent to the PCS pump 159 for subsequent filtering and re-circulation back to the nozzle 123. A sensor 176 is placed within the buffer tank 175 to measure a fluid level therein or to measure an amount of contamination of the collected fluid in various embodiments. In some embodiments, the sensor 176 indicates a near-overflow (HH), high (H) or low (L) solvent level in the buffer tank 175. In some embodiments, the sensor 176 indicates the liquid level by providing a translucent or transparent window with, for example, marked HH, H and L levels that are visible from a side of the buffer tank 175. In some embodiments, the sensor 176 is a float level sensor comprising a float and a stem (not shown). In such embodiments, the float level sensor operates with an internal magnetic reed switch and an external magnetic field mounted in the float. Inside the stem, there is an individual, hermetically sealed, electrically insulated, magnetically activated dry contact reed switch. The reed switch is classified by its maximum power ratings and magnetic sensitivity, the latter of which is used to determine a fluid height. In some embodiments, the sensor 176 is a capacitive liquid level sensor that uses one or more detectors placed at various heights or as a continuous strip, which uses a measured dielectric constant to determine a fluid height. Other types of sensors 176 are readily contemplated. In some embodiments, the controller 500 monitors the sensor 176 to determine whether an alarm condition is present in the buffer tank 175, such as a near or actual overflow due to a clog or the like.

Figure 3:
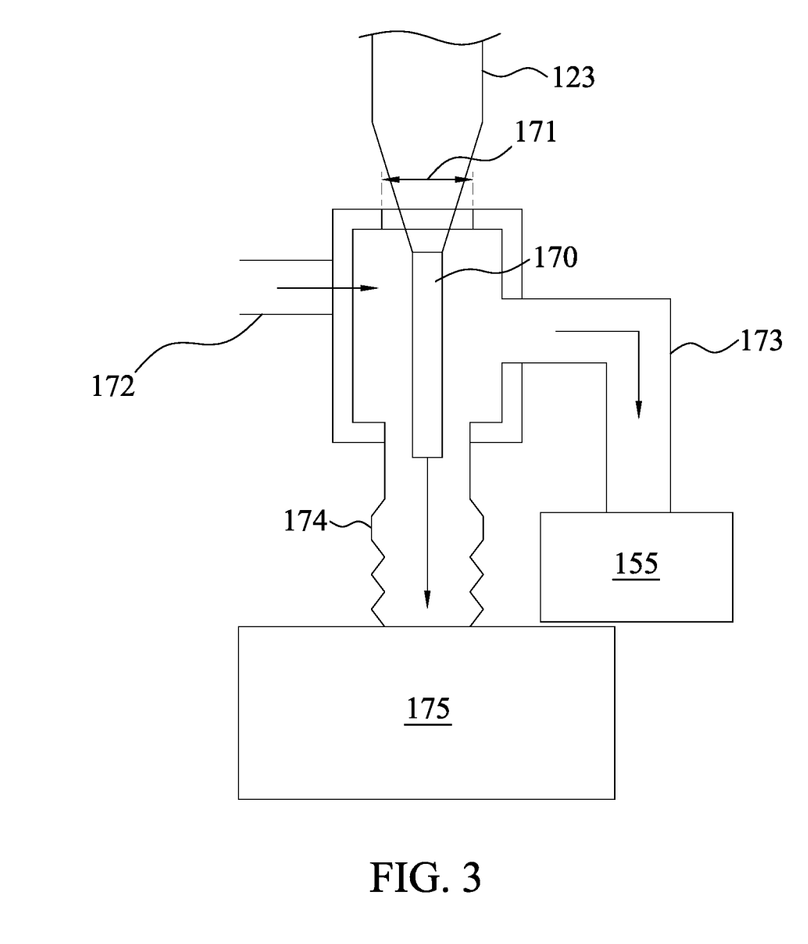
FIG. 3 is nozzle and bath arrangement in accordance with some embodiments.

Turning now to FIG. 3, therein is depicted a nozzle bath arrangement in accordance with various embodiments. In some embodiments, the nozzle 123 is disposed over or inserted partially into a narrowed inlet port 171 for dispensing solvent during wafer processing, a dummy interval or the like. In some embodiments, the nozzle 123 is inserted to prevent the nozzle 123 from drying during an idle period. In some embodiments, the diameter of the inlet port 171 is between approximately 5 and 6 mm in order to prevent particles generated from the manufacturing processes of the apparatus 100 from falling into the solvent in the bath 170. For example, if the diameter is greater than approximately 6 mm, the possibility of particle contamination increases, in some embodiments. If the diameter is smaller than approximately 5 mm, a flow rate of liquid/solvent is insufficient to clean the wafer or remove the photoresist, in some instances.

This bath 170 includes a purge gas inlet 172. In various embodiments, the purge gas is $N_2$, which forces solvent received by the bath 170 from the nozzle 123 to flow smoothly towards the buffer tank 175. In various embodiments, the purge gas inlet 172 is disposed closer to the nozzle 123 than it is to the buffer tank 175 within the bath 170. In various embodiments, the purge gas inlet is disposed closer to the inlet port 171 than it is to the buffer tank 175 within the bath 170. The positioning of the purge gas inlet 172 is advantageous as it prevents an overflow condition or losing recovered solvent to an overflow path 173 by forcing the solvent past that point in the bath 170.

The bath 170 further includes a solvent overflow path 173 for preventing overflow conditions within the bath 170, due to clogging or the like. The overflow path 173 directs any overflow solvent out of the bath 170 towards the drain 155 in order to prevent spillage or the like within the apparatus 100 in some embodiments In various embodiments, the overflow path 173 is disposed between the buffer tank 175 and the purge gas inlet 172 within the bath 170, which is advantageously positioned to prevent an overflow of solvent within the bath 170.

An outlet 174 is provided to allow recovered solvent to flow from the bath 170 in normal operation to the buffer tank 175, which is then directed back to the PCS pump 159 for filtering and re-use by the nozzle 123. In some embodiments, an additional filter or filters (not shown) are disposed between the buffer tank 175 and the PCS pump 159 to filter out contaminants and particulates from the recycled solvent before use. In this manner, the reused solvent is not wasted and, accordingly, materials usage and manufacturing costs are necessarily reduced.

With this innovative solvent recycle system that minimizes chemical consumptions, solvent can be recycled from the nozzle and bath arrangement with the addition of the buffer tank 175 to connect the bath 170 and PCS pump 159. Embodiments of the bath maintain solvent cleanness and smoothly return the solvent to the buffer tank 175. The buffer tank 175 according to embodiments of the disclosure reclaims solvent wastes dispensed from the nozzle 123 in lithography and photolithography processes or the like.

Figure 4:
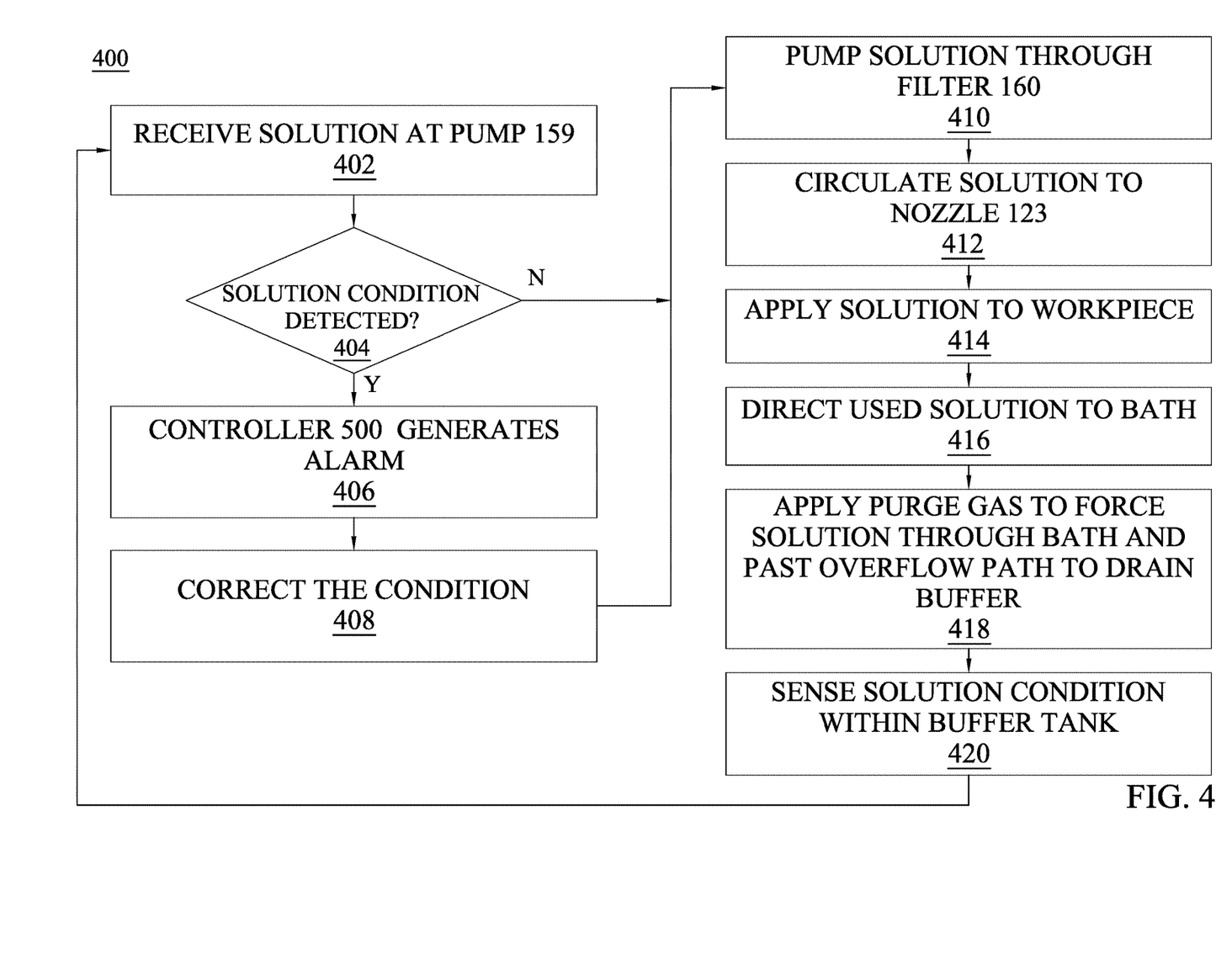
FIG. 4 is a flow chart of a recycling process in accordance with some embodiments.

FIG. 4 is a flow chart of a solvent recycling process 400 in accordance with various embodiments. At operation 402, the solvent or solution is received at the PCS pump 159. At operation 404, the controller 500 determines whether an alarm condition relating to the apparatus 100 or system 200 is detected. If so, the process 400 continues to 406. Otherwise, the process 400 continues to operation 410.

From operation 404, when an alarm condition is detected via sensor 176 or the like, the controller 500 generates an alarm at operation 406. In various embodiments, the manufacturing process is responsively halted. At operation 408, the alarm condition is identified and corrected.

From either operation 404 or 408 above, the process 400 continues to operation 410 where the solvent is pumped through the filter 160 by the PCS pump 159. At operation 412, the solvent is circulated to the nozzle 123. At operation 414, the nozzle 123 applies the solution to the substrate 110, or, in a dummy interval period, dispenses solvent for a dummy dispense time.

Next, at operation 416, the dispensed solvent is directed to the bath 170. At operation 418, a purge gas, such as a nitrogen purge gas, forces the solvent through the bath 170, past the overflow path 173 to the buffer tank 175. At operation 420, a condition of the solvent within the buffer tank 175 is sensed by the sensor 176. The process 400 is continuous during operation of the apparatus 100 in the absence of any sensed alarm conditions in various embodiments. In some embodiments, the sensed condition is a fluid level. In other embodiments, the sensed condition is a contamination level of the solvent. If the sensed condition is normal, the recover solvent is directed from the buffer tank 175 to the PCS pump 159 for eventual re-circulation to the nozzle 123.

Figure 5A:
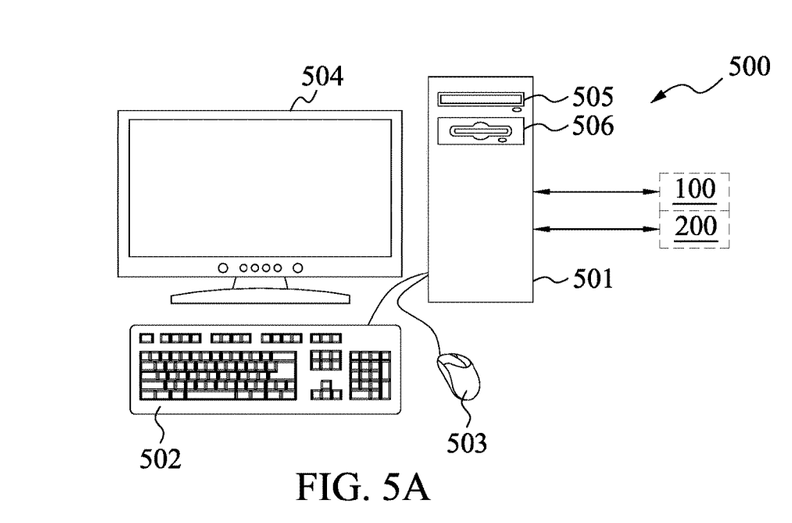
FIG. 5A and FIG. 5B are diagrams of a controller in accordance with some embodiments.
Figure 5B:
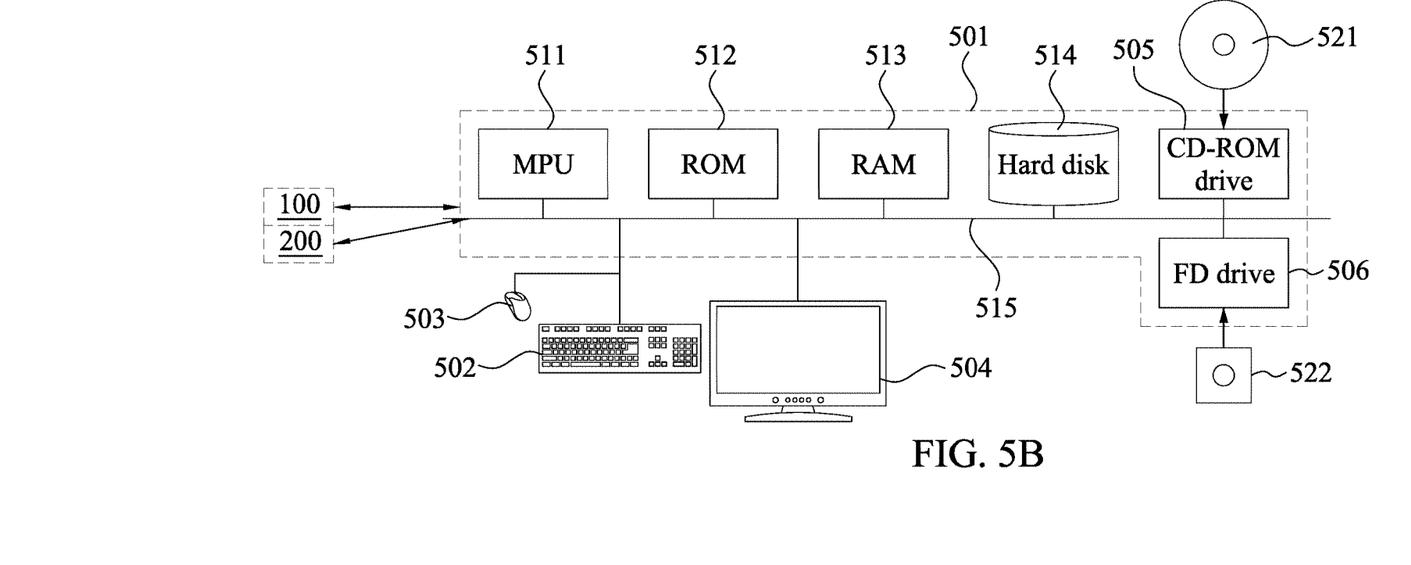

FIG. 5A and FIG. 5B illustrate the controller 500 for controlling and monitoring the apparatus 100 and the system 200 in accordance with various embodiments of the present disclosure FIG. 5A is a schematic view of a controller 500 that controls the apparatus 100 of FIG. 1. In some embodiments, the controller 500 is programmed to initiate a monitor fluid level or contamination levels of buffer tank contents via the sensor 176 and generate an alarm in response to any abnormal conditions. In some embodiments, manufacturing of semi-conductor devices is halted in response to such an alarm. In some embodiments, a clean in place process is initiated in response to the activation of such an alarm. As shown in FIG. 5A, the controller 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 5B is a diagram showing an internal configuration of the controller 500. In FIG. 5B, the computer 501 is provided with, in addition to the optical disk drive 505 and the magnetic disk drive 506, one or more processors 511, such as a micro-processor unit (MPU) or a central processing unit (CPU) a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that in some embodiments the computer 501 includes a network card (not shown) for providing a connection to a computer network such as a local area network (LAN), wide area network (WAN) or any other useful computer network for communicating data used by the computer system 500 and the apparatus 100.

The program for causing the controller 500 to execute the process for controlling the apparatus 100 of FIG. 1, and components thereof and/or to execute the process 400 according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from the network.

The stored programs do not necessarily have to include, for example, an operating system (OS) or a third party program to cause the computer 501 to execute the methods disclosed herein. In various embodiments, the program only includes a command portion to call an appropriate function (module) in a controlled mode and obtain desired results in some embodiments. In various embodiments described herein, the controller 500 is in communication with the apparatus 100 to control various functions thereof. In various embodiments, the controller 500 automatically directs when to start and/or stop a recycling process, for example, when a high fluid level or overflow condition is detected by the sensor 176.

The controller 500 can be configured to provide control data to system components and receive process and/or status data from system components of the apparatus 100 including the system 200. For example, the controller 500 includes a microprocessor, a memory (e.g, volatile or non-volatile memory), and a digital I/O port capable of generating control voltages sufficient to communicate and activate inputs to the apparatus 100, as well as monitor outputs from the apparatus 100. Furthermore, the controller 500 is configured to analyze the process and/or status data, to compare the process and/or status data with target process and/or status data, and to use the comparison to change a process and/or control a system component. In addition, the controller 500 is configured to analyze the process and/or status data, to compare the process and/or status data with historical process and/or status data, and to use the comparison to predict, prevent, and/or declare a fault or alarm.

The solvent recycle system introduced herein minimizes chemical waste, thereby reducing manufacturing costs. In various embodiments, solvent is returned from the nozzle bath with addition of a buffer tank 175 to connect the bath 170 and the PCS pump 159. A high frequency interval dispense can be used for better defect performance without inducing high operational cost. Since chemical wastes and operational cost can be significantly reduced even at high frequency interval dispense, the dummy frequency used by the apparatus 100 can be more flexible without being limited by cost concerns.

According to various embodiments an apparatus comprises: a pump for circulating a solution to a nozzle; a nozzle for dispensing the solution; a nozzle bath for accommodating a tip end of the nozzle and for receiving the solution after dispensing, and comprising a purge gas inlet and an overflow path; a buffer tank for receiving the solution from the bath and circulating the solution back to the pump. In some embodiments, the nozzle is a spin nozzle. In some embodiments, the solution is at least one of a photoresist, a negative tone developer and a reducing resist consumption solution. In some embodiments, a flow meter disposed between the pump and the nozzle In some embodiments, a purge gas inlet is disposed within the nozzle bath for directing the flow of the solution to the buffer tank. In some embodiments, the purge gas inlet is disposed closer to the nozzle than it is to the buffer tank. In some embodiments, an overflow path is disposed between the nozzle bath and a drain in order to prevent an overflow condition. In some embodiments, the overflow path is disposed between the buffer drain and a purge gas inlet within the nozzle bath. In some embodiments, the nozzle bath has a narrow port for receiving the nozzle and preventing particles outside the nozzle form entering the nozzle bath. In some embodiments, the buffer tank has a sensor that includes at least one of a fluid level monitor and a particle contamination detector. In some embodiments, a controller monitors the sensor and generates an alarm based on the sensor reading. In some embodiments, a filter is disposed between the pump and the nozzle. In some embodiments, a flow meter is disposed between the filter and the nozzle In some embodiments, a valve is disposed between the flow meter and the nozzle.

According to various embodiments, an apparatus for a wet process performed in a semiconductor manufacturing process includes a bath for receiving solution from a nozzle after application to a workpiece; a gas inlet that receives a purge gas that is introduced to the bath in order to force flow of the solution away from the workpiece, an overflow path from the bath to a drain for preventing an overflow condition; and a buffer tank for receiving the solution from the bath and circulating the solution to a pump that returns the solution to the nozzle. In some embodiments, the gas inlet is closer to the inlet port than to the buffer tank. In some embodiments, the overflow path is disposed between the buffer tank and the gas inlet in the bath. In some embodiments, a sensor monitors a particulate level of the solution in the buffer tank.

According to various embodiments, a method of operating a wet process apparatus comprises applying a solution to a workpiece from a nozzle; directing the solution from the workpiece to a bath through an inlet port; injecting a purge gas into the bath to force flow of the solution from the bath to a buffer tank; monitoring a condition of the fluid within the buffer tank with a sensor, and circulating the solution to a pump and then through a filter before returning the solution to the nozzle. In some embodiments, an overflow path is disposed closer to the buffer tank than the gas inlet in order to prevent an overflow condition in the bath. In some embodiments, determining a fluid level condition in the bath is determined using the sensor and an alarm is generated by a controller when a threshold value of the fluid level condition is determined.

The foregoing outlines features of several embodiments or examples so that those skilled in the art will better understand the aspects of the present disclosure. Those skilled in the art should appreciate that they can readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. An apparatus comprising:
a pump configured to circulate a solution;
a nozzle configured to dispense the solution;
a nozzle bath configured to accommodate a tip end of the nozzle and to receive the solution after the dispensing, the nozzle bath comprising a purge gas inlet and an overflow path;
a drain configured to accept overflow solution; and
a buffer tank configured to receive the solution from the nozzle bath and to circulate the solution back to the pump,
wherein the overflow path directs the overflow solution out of the nozzle bath to the drain via an overflow outlet for preventing an overflow condition, and
wherein the purge gas inlet is disposed on one side of the nozzle bath, the overflow path is disposed on an opposite side of the nozzle bath relative to the purge gas inlet, and the overflow path is configured to connect to the nozzle bath only via the overflow outlet.

2. The apparatus of claim 1 wherein the nozzle is a spin nozzle.

3. The apparatus of claim 1, further comprising a flow meter disposed between the pump and the nozzle.

4. The apparatus of claim 1, wherein the purge gas inlet directs the solution to the buffer tank.

5. The apparatus of claim 1, wherein the purge gas inlet is disposed closer to the nozzle than it is to the buffer tank.

6. The apparatus of claim 1, wherein the overflow path is disposed between the nozzle bath and the drain in order to prevent the overflow condition in the nozzle bath.

7. The apparatus of claim 1, wherein the overflow path is disposed between the buffer tank and the purge gas inlet within the nozzle bath.

8. The apparatus of claim 1, wherein the nozzle bath comprises a narrow port configured to receive the nozzle and to prevent particles outside the nozzle from entering the nozzle bath.

9. The apparatus of claim 1, wherein the buffer tank comprises a sensor that includes at least one of a fluid level monitor and a particle contamination detector.

10. The apparatus of claim 9, further comprising:
a controller configured to monitor the sensor and generate an alarm based on a sensor reading.

11. The apparatus of claim 1, further comprising a filter disposed between the pump and the nozzle.

12. The apparatus of claim 11, further comprising a flow meter disposed between the filter and the nozzle.

13. The apparatus of claim 12, further comprising a valve disposed between the flow meter and the nozzle.

14. An apparatus for a wet process performed in a semiconductor manufacturing process, comprising:
a bath configured to receive solution from a nozzle;
a gas inlet configured to receive a purge gas that is introduced to the bath to force flow of the solution away from a workpiece;
a drain configured to accept overflow solution;
an overflow path configured to direct the overflow solution out of the bath to the drain via an overflow outlet for preventing an overflow condition; and
a buffer tank configured to receive the solution from the bath and to circulate the solution to a pump that returns the solution to the nozzle,
wherein the gas inlet is disposed on one side of the bath, the overflow path is disposed on an opposite side of the bath relative to the gas inlet, and the overflow path is configured to connect to the bath only via the overflow outlet.

15. The apparatus of claim 14 wherein the gas inlet is closer to an inlet port than to the buffer tank.

16. The apparatus of claim 14 wherein the overflow path is disposed between the buffer tank and the gas inlet in the bath.

17. The apparatus of claim 14 further comprising a sensor configured to monitor a contamination level of the solution in the buffer tank.

18. A wet process apparatus, comprising:
a nozzle configured to dispense a solution;
an inlet port through which the solution is dispensed;
a bath configured to receive the dispensed solution;
a buffer tank;
a drain configured to accept overflow solution;
an overflow path configured to direct the overflow solution out of the bath to the drain via an overflow outlet for preventing an overflow condition;
a purge gas inlet configured to inject a purge gas into the bath to force flow of the solution from the bath to the buffer tank;
a sensor configured to monitor a condition of the solution within the buffer tank;
a pump configured to circulate solution; and
a filter through which solution is circulated before the solution is returned to the nozzle,
wherein the purge gas inlet is disposed on one side of the bath, the overflow path is disposed on an opposite side of the bath relative to the purge gas inlet, and the overflow path is configured to connect to the bath only via the overflow outlet.

19. The wet process apparatus of claim 18, wherein the overflow path is disposed closer to the buffer tank than the gas inlet.

20. The wet process apparatus of claim 18, wherein the sensor is further configured to:
determine a fluid level condition in the bath; and
generate an alarm at a controller when a threshold value of the fluid level condition is determined.

* * * * *